United States Patent [19]
Jackson

[11] Patent Number: 5,410,124
[45] Date of Patent: Apr. 25, 1995

[54] TRACKING SENSOR FIXTURE AND METHOD FOR TRACKING REFERENCE LOCATIONS ON A MOVING SEMICONDUCTOR LEADFRAME STRIP

[75] Inventor: Timothy L. Jackson, Boise, Id.

[73] Assignee: Micron Technology, Inc., Boise, Id.

[21] Appl. No.: 40,465

[22] Filed: Apr. 1, 1993

[51] Int. Cl.⁶ .................. B23K 26/00; H01L 21/68
[52] U.S. Cl. .................. 219/121.68; 226/45; 250/548; 437/206; 437/220
[58] Field of Search .................. 219/121.68; 226/45; 198/345.1, 345.2; 118/669; 250/548, 557; 204/206, 224 R; 437/206, 207, 220, 230; 29/741, 759, 709; 228/4.5

[56] References Cited

U.S. PATENT DOCUMENTS

| | | | |
|---|---|---|---|
| 3,957,614 | 5/1976 | Corby et al. | 204/224 R |
| 4,236,301 | 12/1980 | Hug et al. | 29/741 |
| 4,375,025 | 2/1983 | Carlson | 219/121.68 |
| 4,409,924 | 10/1983 | Laverty et al. | 118/406 |
| 4,420,107 | 12/1983 | Seyffert et al. | 226/45 |
| 4,505,225 | 3/1985 | Husaim | 118/669 |
| 4,534,843 | 8/1985 | Johnson et al. | 204/224 R |
| 4,553,501 | 11/1985 | Kobayashi et al. | 118/669 |
| 5,059,559 | 10/1991 | Takahashi et al. | 437/220 |
| 5,114,557 | 5/1992 | Jahani | 204/206 |
| 5,186,719 | 2/1993 | Egashira et al. | 437/206 |
| 5,307,978 | 5/1994 | Ricketson et al. | 228/4.5 |

Primary Examiner—Geoffrey S. Evans
Attorney, Agent, or Firm—Stephen A. Gratton

[57] ABSTRACT

A tracking sensor fixture for mounting an optic sensor and for positioning reference locations on semiconductor leadframe strips with the sight line of the sensor is provided. The tracking sensor fixture includes a movable support frame and a guide member mounted to the support frame. The guide member includes a roller bearing that is biased into contact with an edge of a moving leadframe strip, regardless of the vertical location of the leadframe strip, by a spring acting on the movable support frame.

20 Claims, 2 Drawing Sheets

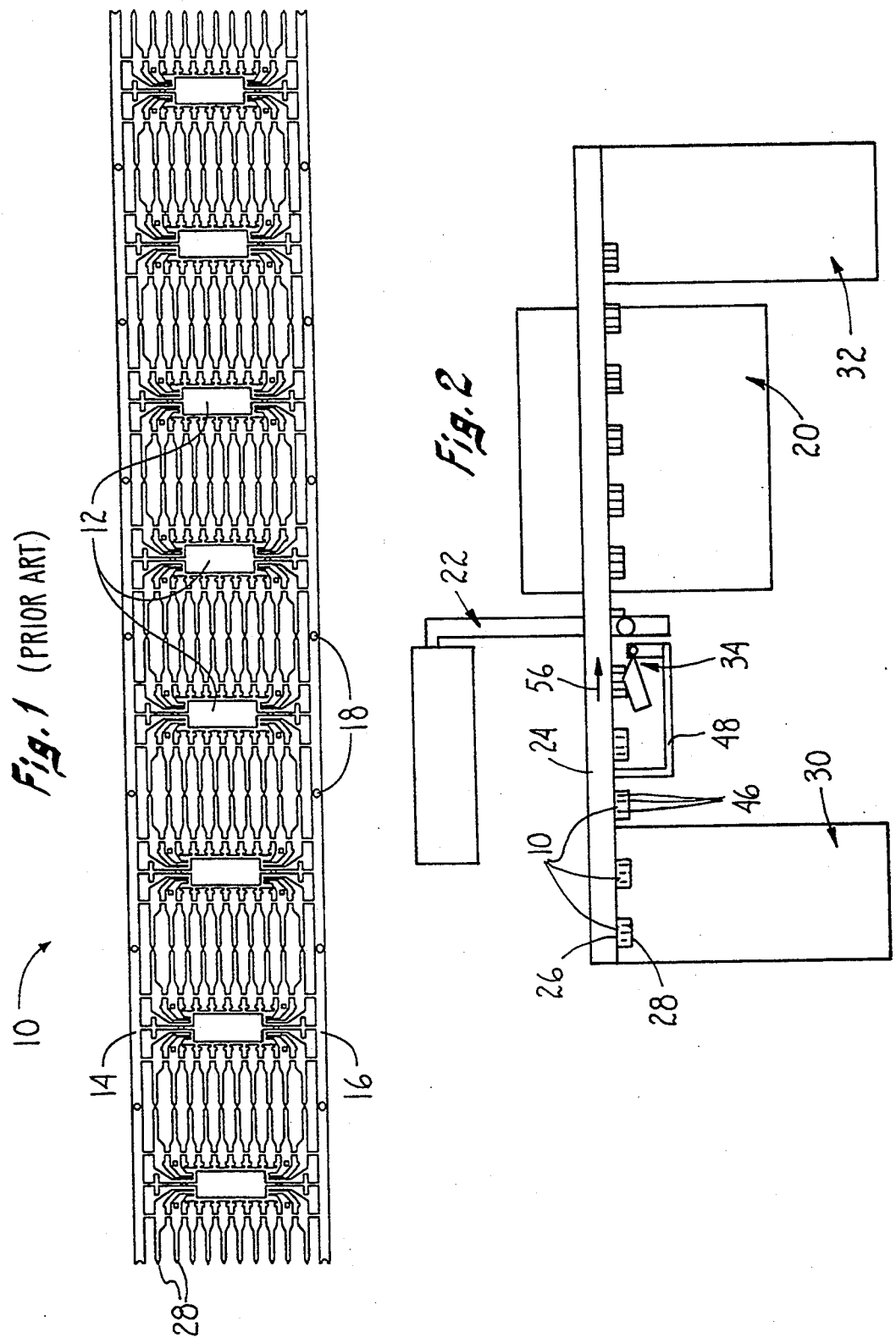

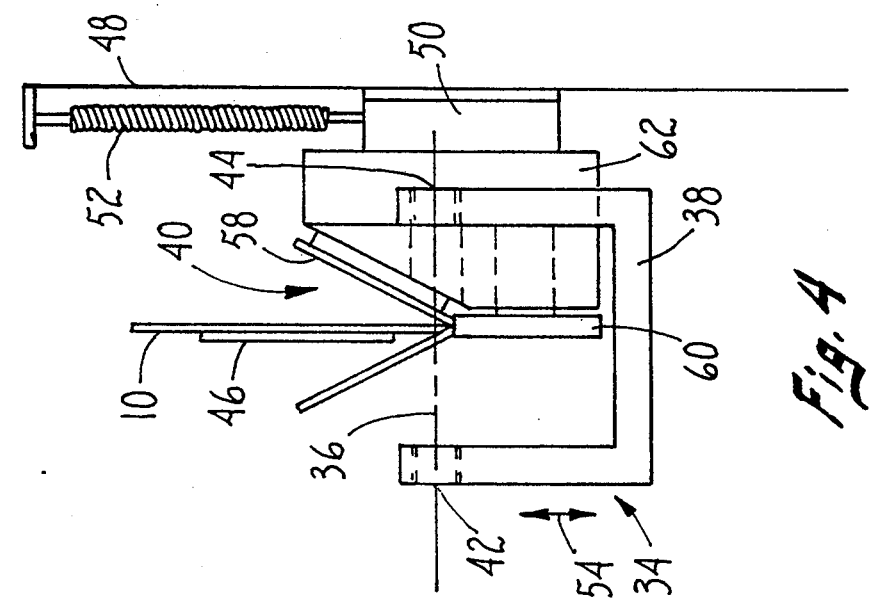
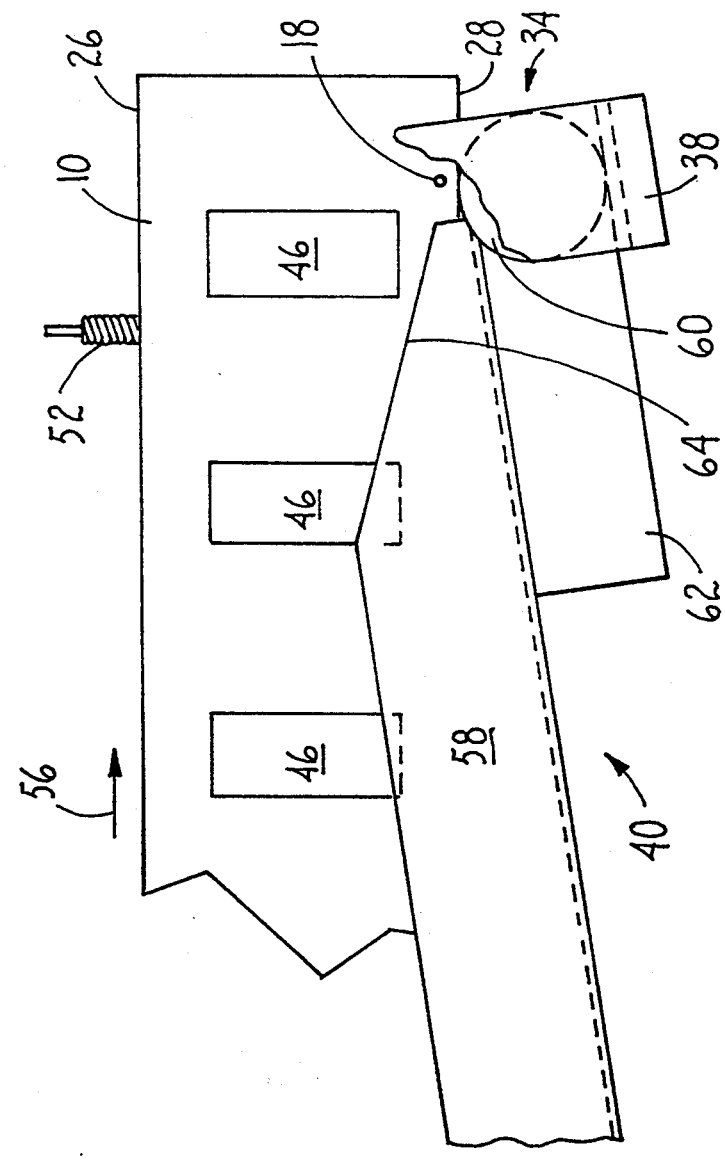

TRACKING SENSOR FIXTURE AND METHOD FOR TRACKING REFERENCE LOCATIONS ON A MOVING SEMICONDUCTOR LEADFRAME STRIP

FIELD OF THE INVENTION

This invention relates to semiconductor manufacture and to the tracking of semiconductor packages formed on a moving leadframe strip. More particularly, the present invention relates to a novel method and apparatus for precisely positioning reference locations on a moving leadframe strip in a sight line of an optic sensor.

BACKGROUND OF THE INVENTION

In semiconductor manufacture, a single semiconductor die (or chip) is typically mounted within a sealed package. In general, the package protects the die from damage (e.g. breakage, physical abuse) and from contaminants in the surrounding environment. In addition, the package provides a substantial lead system for connecting the electrical devices formed on the die to a printed circuit board or other external circuitry.

Typically, the initial component in the packaging process is a leadframe or leadframe strip. A leadframe strip is a metal frame which is several inches long. The leadframe strip supports each semiconductor die for packaging and provides the leads for the final semiconductor package. A typical leadframe strip is produced from metal sheet stock (e.g. a copper alloy) and is adapted to mount several (e.g. eight) semiconductor packages. A leadframe strip typically includes side rails on either side which are formed with a row of circular openings or holes. The side rails and the holes in the side rails, facilitate transport and indexing of the leadframe strip by automated packaging machinery. As an example, the leadframe strips may be removably clipped to carrier belts that move the leadframe strips through the various manufacturing operations.

During a conventional packaging process, the dies are attached to mounting paddles formed on the leadframe strip. Also during the packaging process, the bond pads formed on each die are electrically connected to the lead fingers of the leadframe strip using fine bond wires. Following the application of a polymide protective layer to the faces of the dice, each die and a portion of the leadframe strip to which it is attached, is encapsulated in a plastic material to form the semiconductor. Following encapsulation, the semiconductor packages require a deflashing process for removing excess molding material from the package exterior. A trim and form operation is then used to separate the resultant interconnected packages and to bend the leads of each semiconductor package into the proper configuration.

During the packaging process it is often necessary to track the location of the dies or of the semiconductor packages, on the moving leadframe strips. As an example, following encapsulation of a die, it may be necessary to track the location of the semiconductor packages on the leadframes in order to imprint a visual code on the exterior of each semiconductor package. Typical information coded on the package includes product the, product specifications and the date of manufacture.

For imprinting such a visual code, a laser inscription process can be used. With laser inscription, a laser is pulsed in a predetermined pattern onto the semiconductor packages as the leadframe strip is moved by a carrier belt past the laser. The laser is typically fired by an optic sensing device that is triggered by the holes in the siderails, or other reference locations, on the leadframe strips. The optic sensing device includes a light source (i.e. sender) and a photocell (i.e. receiver) facing each other on opposite sides of the leadframe. As a reference location on the leadframe strips moves past the light source, the light beam from the light source passes through the reference location to the photocell to make (or break) a control circuit and fire the laser.

A problem with triggering a laser in this manner is that the reference locations must be precisely aligned with the path of the light beam (i.e. optic sight line) from the light source. Any misalignment between the light source and the moving reference locations will block the path of the light beam causing the inscription laser to misfire or to not fire at all. This may cause the printed visual code to be illegible or missing on some of the semiconductor packages.

It is sometimes difficult to align an optic sensor with reference locations on the leadframe strips, because the carrier belts for moving the leadframe strips are often very long (e.g. 200 feet) and move relatively fast (e.g. 30 ft/min). The carrier belts are thus prone to move up and down or oscillate in a wave like pattern with respect to a stationary sensing device. Since reference locations, such as the holes in the leadframe strips, are only about 5 mil in diameter, very little up and down movement of a carrier belt is required to completely misalign the light source and reference locations.

The present invention is directed to a tracking sensor fixture that is adapted to precisely align reference locations (e.g. holes) of a moving leadframe strip with the optic sight line of an optic sensor. The tracking sensor fixture can thus be used in a semiconductor manufacturing operation, such as during laser inscription, to facilitate timing of the process.

Accordingly, it is an object of the present invention to provide a novel and improved method and apparatus for mounting an optic sensor and for aligning reference locations on a moving semiconductor leadframe strip with the sensor. It is a further object of the present invention to provide a tracking sensing fixture for precisely aligning reference locations, such as reference holes, formed on a moving semiconductor leadframe strip, with the optic sight line of an optic sensor. It is yet another object of the present invention to provide a tracking sensor fixture for mounting optic sensors that is reliable, relatively inexpensive to construct and operate, and which is adaptable for use in large scale semiconductor manufacture.

SUMMARY OF THE INVENTION

In accordance with the present invention, a tracking sensor fixture, and method for tracking reference locations on a moving semiconductor leadframe strip are provided. In an illustrative embodiment of the invention, the tracking sensor fixture is adapted to mount an optic sensor and to align reference locations, such as holes, on a moving leadframe strip, with the optic sight line of the optic sensor.

The tracking sensor fixture, generally stated, includes a slidably mounted support frame for mounting a sender and receiver component of the sensor and a guide member mounted to the support frame. The guide member is biased for contacting the leadframe strips and placing reference locations on the leadframe strips into alignment with the optic sight line of the optic sensor.

During a semiconductor manufacturing operation, leadframe strips are carried by a carrier belt past the tracking sensor fixture. The support frame of the tracking sensor fixture is mounted with respect to the carrier belt such that a lower edge of each leadframe strip is contacted and guided by a v-shaped guide plate and roller bearing of the guide member as the leadframe strips moves past the tracking sensor fixture. The support frame of the tracking sensor fixture is mounted on a slide bearing and moves up and down with respect to the carrier belt to compensate for differences in the vertical location of the leadframe strips on the carrier belt. A spring biases the guide member of the tracking sensor fixture into contact with the leadframe strips. This precisely aligns the holes formed along the bottom edge of each moving leadframe strip with the optic sight line of the optic sensor.

The tracking sensor fixture is adapted to track reference locations on a moving leadframe strip by a method that, generally stated, includes the steps of:
  providing a movable fixture having a guide member and an optic sensor thereon;
  positioning the movable fixture with respect to the moving leadframe strip so that an edge of the leadframe strip is contacted by the guide member regardless of its vertical location and reference locations on the leadframe strip are aligned with a sight line of the optic sensor; and
  using the reference locations to control a semiconductor manufacturing operation such as laser inscription.

These and other objects, features and advantages of the invention will be apparent from the following more particular description of the preferred embodiments of the invention as illustrated in the accompanying drawings.

BRIEF DESCRIPTION OF THE DRAWINGS

FIG. 1 is a plan view of a prior art semiconductor leadframe strip;

FIG. 2 is a schematic side elevation view showing a tracking sensor fixture constructed in accordance with the invention mounted on a carrier belt for use in a laser inscription and deflash process;

FIG. 3 is a side elevation view partially cut away of a tracking sensor fixture constructed in accordance with the invention; and FIG. 4 is an end view of FIG. 3.

DETAILED DESCRIPTION OF THE PREFERRED EMBODIMENTS

A typical leadframe strip 10 is depicted in FIG. 1. The leadframe strip 10 is adapted to mount eight semiconductor dice (not shown) for packaging. The leadframe strip 10 includes paddles 12 for mounting the individual semiconductor dice. In addition, the leadframe strip 10 includes parallel spaced strip rails 14, 16 formed with a pattern of holes 18 to facilitate handling by automated machinery. Some of the holes 18 on the leadframe strip 10 may also be utilized as reference locations in accordance with the present invention.

From the point in the manufacturing process where the paddles 12 are coated with adhesive for die bonding, until the point where the individual semiconductor packages or chips are separated from the leadframe strip rails 14,16 during a trim and form process, a leadframe strip 10 is treated as a unit in the semiconductor manufacturing process. The leadframe strips 10 are transported through automated machinery which perform the different manufacturing steps (e.g. die bonding, wire bonding, encapsulation).

One phase of a semiconductor manufacturing process is shown in FIG. 2. A deflash apparatus 20, is adapted to remove excess plastic molding material from the semiconductor packages 46 formed on the leadframe strip 10. In general, such a deflash apparatus 20, contains an electrolytic solution for contacting and removing the excess plastic packaging material. Prior to the deflash process however, a code is imprinted on the semiconductor packages 46 formed on the leadframe strip 10. A laser scribe apparatus 22 is used to print the visual code. This is the laser inscription process that was previously described.

A carrier belt 24 is adapted to continuously move the leadframe strips 10, with the semiconductor packages 46 formed thereon, through the laser scribe apparatus 22 and through the deflash apparatus 20. The leadframe strips 10 are loaded onto the carrier belt 24 at a load station 30 and unloaded at an unload station 32. The leadframe strips 10 are suspended from the carrier belt 24 on clips (not shown) which engage a strip rail 14 or 16 (FIG. 1), of the leadframes 10. An upper edge 26 of each leadframe strip 10 is engaged by the carrier belt 24. A lower edge 28 of each leadframe strip 10 is not contacted by the carrier belt 24. The leadframe strips 10 thus hang from the carrier belt 24. As the leadframe strips 10 are moved by the carrier belt 24, the holes 18 (FIG. 1) on the lower edge 28 of the leadframe strips 10 function as the reference locations for triggering the laser scribe apparatus 22.

The tracking sensor fixture of the invention is located upstream of the laser scribe apparatus 22 and is generally designated as 34. The tracking sensor fixture is adapted to mount the sender and receiver components of an optic sensor such as a fiber optic sensor that includes fiber optic components. Such fiber optic sensors are well known in the art. The optic sensor may also be an optic sensor that includes reflective elements.

In addition to providing a mount for an optic sensor, the tracking sensor fixture 34 is also adapted to engage the lower edge 28 of the moving leadframe strips 10 and precisely align the holes 18 on the lower edges 28 of the leadframe strips 10 with an optic sight line 36 (FIG. 4) of the optic sensor. As such, the holes 18 function as reference locations for triggering the laser scribe apparatus 22.

Referring now to FIGS. 3 and 4, the tracking sensor fixture 34 is shown in detail. The tracking sensor fixture 34 includes a support frame 38 and a guide member 40. The leadframe strips 10 held on the carrier belt 24 (FIG. 2) move as indicated by directional arrow 56 over the guide member 40 of the tracking sensor fixture 34.

The optic sensor for the tracking sensor fixture 34 includes a sender component 42 and a receiver component 44. These components 42, 44 of the optic sensor are mounted to the support frame 38 for the tracking sensor fixture 34. An optic sight line 36 extends from the sender component 42 to the receiver component 44. As seen in FIG. 3 the support frame 38 is generally u-shaped and the optic sight line 36 passes through the path of the leadframe strip 10. A primary object of the tracking sensor fixture 34 is to align the optic sight line 36 with the holes 18 in the leadframe 10 strips to permit an accurate triggering of the laser scribe apparatus 22.

To accommodate different vertical locations of the leadframe strips 10, the support frame 38 for the tracking sensor fixture 34 is slidably mounted with respect to the carrier belt 24 on a slide bearing 50. The slide bearing 50 may be mounted to a stationary support brace 48 attached to the frame (not shown) for the carrier belt 24 (FIG. 2). A spring member 52 is attached to the stationary support brace 48 and to a movable member of the slide bearing 50. With this arrangement the support frame 38 and guide member 40 of the tracking sensor fixture 34 may float or move up and down as indicated by arrow 54. As the leadframe strips 10 move past the tracking sensor fixture 34, the spring member 52 biases the guide member 40 into contact with the moving leadframes strip 10.

The guide member 40 of the tracking sensor fixture 34 includes a generally v-shaped guide plate 58 and a circular roller bearing 60. As shown in FIG. 3, the movable support frame 38 for the tracking sensor fixture 38 is mounted at an angle with respect to the lower edge 28 of the moving leadframe strips 10. The v-shaped guide plate 58 of the guide member 40 is thus also situated at an angle with respect to the lower edge of the leadframe strip 10. As also shown in FIG. 3, the v-shaped guide plate 58 has clipped upstream corners 64 and is positioned to not interfere with the sight line 36 of the optic sensor.

The roller bearing 60 of the guide member 40 is freely rotatably mounted on a mounting block 62 (FIG. 3) attached to the v-shaped guide plate 58 and to the movable support frame 38. With this arrangement moving leadframe strips 10 are guided by the v-shaped guide plate 58 into contact with and over the surface of the roller bearing 60. The movable support frame 38 for the tracking sensor fixture 34 is constructed and dimensioned such that with a leadframe strip 10 in contact with the roller bearing 60, the holes 18 (FIG. 3) in the leadframe strip 10 will precisely align with the optic sight line 36 (FIG. 4). Stated differently, the distance from the bottom edge 28 of the leadframe strip 10 to the center line of the holes 18 in the leadframe strip 10 is equal to the distance from the outside diameter of the roller bearing 60 to the optic sight line 36.

Since the v-shaped guide plate 58, the roller bearing 60 and the optic sight line 36 are all tied to the movable support frame 38, each of these elements also move with the movable support frame 38. Any up and down movement of the movable support frame 38 caused by a changing vertical location of the leadframe strips 10 will thus not affect the alignment of the leadframe holes 18 with the sight line 36.

Operation

In operation of the tracking sensor fixture 34, leadframe strips 10 are moved by the carrier belt 24 as indicated by directional arrow 56. As the leadframe strips 10 move past the tracking sensor fixture 34, they are guided by the v-shaped guide plate 58 onto the roller bearing 60. As previously explained, the movable support frame 38 of the tracking sensor fixture 34 floats on the slide bearing 50. At the same time, the spring member 52 biases the guide plate 58 and roller bearing 60 against the bottom edge 28 of the leadframe strip 10. Since the guide plate 58 and roller bearing 60 float with the slidably mounted support frame 38, the optic sight line 36 of the tracking sensor fixture 34 automatically self aligns with the holes 18 of the moving leadframe strips 10. Any vertical misalignment of the leadframe strips 10 caused by up and down movement of the carrier belt 24 is thus accommodated by the changing location of the tracking sensor fixture 34.

The holes 18 in the leadframe strips 10 can thus be used as reference locations to trigger the laser inscription apparatus 22 (FIG. 2) and imprint a visual code on the semiconductor packages 28. Alternately, features other than the holes 18 on the leadframe strips 10 can be used as reference locations to trigger the laser inscription apparatus. In addition, processes other than laser inscription can be controlled by a tracking sensing fixture constructed in accordance with the invention.

Thus, the tracking sensor fixture of the invention provides a simple yet effective apparatus for mounting an optic sensor and for aligning semiconductor leadframe strips with the sight line of the optic sensor. Although the invention has been described in terms of a preferred embodiment, as will be apparent to those skilled in the art that other applications of the inventive concepts disclosed herein are possible. It is intended therefore that the following claims include such alternate embodiments.

What is claimed is:

1. In semiconductor manufacture, a tracking apparatus for aligning reference locations on a moving semiconductor leadframe strip optic sensor, said tracking apparatus comprising:

a support frame moveably mounted with respect to the moving leadframe strips;

a sender component and a receiver component of an optic sensor mounted to the movable support frame and adapted to provide an optic sight line through the leadframe strip;

a guide means mounted to the movable support frame for contacting the leadframe strip and precisely position the reference locations on the leadframe strip with respect to the optic sight line so that the reference locations pass through the optic sight line; and biasing means for biasing the guide means into contact with the leadframe strip.

2. The tracking apparatus as claimed in claim 1 and wherein the movable guide means includes a v-shaped guide member and a roller bearing for contacting an edge of the leadframe strip for precisely positioning the reference locations with respect to the sight line.

3. The tracking apparatus as claimed in claim 2 and wherein the reference locations are holes formed along an edge of the leadframe strip.

4. The tracking apparatus as claimed in claim 3 and wherein the leadframe strips are moved by a carrier belt and the movable support frame is attached to a support member for the carrier belt.

5. The tracking apparatus as claimed in claim 4 and wherein the guide member and roller bearing contact a lower edge of the moving leadframe strips suspended from a carrier belt.

6. The tracking apparatus as claimed in claim 5 and wherein the optic sensor controls a laser inscription apparatus.

7. In semiconductor manufacture wherein leadframe strips are removably attached to and moved by a carrier belt, a tracking sensor apparatus mounting an optic sensor and positioning the moving leadframe strips so that reference locations formed on the leadframe strips are aligned with an optic sight line of the optic sensor, said tracking apparatus comprising:

a support frame slidably mounted for up and down movement with respect to the carrier belt and leadframe strips and adapted for mounting a sender component and a receiver component of the optic sensor to provide an optic sight line through the leadframe strips;

a guide member mounted to the support frame and including a generally v-shaped guide plate and a roller bearing for contacting an edge of the moving leadframe strips and aligning the optic sight line with the reference locations; and a spring member attached to the support frame for biasing the guide member and roller bearing into contact with the edge of the moving leadframe strips.

8. The tracking apparatus as claimed in claim 7 and wherein the reference locations are holes formed along an edge of the leadframe strips.

9. The tracking apparatus as claimed in claim 7 and wherein the leadframe strips are suspended from the carrier belt and the guide plate and roller bearing contact a lower edge of the leadframe strips.

10. The tracking apparatus as claimed in claim 7 and wherein the support frame is slidably mounted on a slide bearing.

11. The tracking apparatus as claimed in claim 7 and wherein the support frame is attached to a stationary support for the carrier belt.

12. The tracking apparatus as claimed in claim 7 and wherein the optic sensor controls a laser inscription apparatus.

13. The tracking apparatus as claimed in claim 7 and wherein the v-shaped guide member is mounted at an angle with respect to an edge of the moving leadframe strips.

14. The tracking apparatus as claimed in claim 7 and wherein the distance from an outside diameter of the roller bearing to the subject line is equal to the distance from the edge of the leadframe strips to a centerline of the reference locations.

15. In semiconductor manufacture wherein semiconductor leadframe strips are moved on a carrier belt, a method for aligning reference locations on the leadframe strips with an optic sight line of an optic sensor, comprising the steps of:

providing a movable fixture for the optic sensor, said fixture having a guide member for the leadframe strips and with a sender component and a receiver component of the optic sensor mounted on the fixture to provide a sight line through the leadframe strips;

positioning the movable fixture with respect to the moving leadframe strip so that an edge of the leadframe strip is contacted by the guide member regardless of its vertical location and the reference locations on leadframe strips are aligned with the sight line of the optic sensor; and using the reference locations to control a semiconductor manufacturing operation.

16. The method as recited in claim 15 and wherein the reference locations comprise holes formed along a side rail of the leadframe strips.

17. The method as recited in claim 16 and further comprising biasing the movable fixture into contact with the leadframe strip using a spring member.

18. The method as recited in claim 17 and wherein the guide member comprises a generally v-shaped guide plate and a roller bearing.

19. The method as recited in claim 18 and wherein the movable fixture includes a movable support frame slidably mounted on a slide bearing.

20. The method as recited in claim 19 and wherein the semiconductor manufacturing operation controlled is a laser inscription process for printing a visual code on semiconductor packages formed on the leadframe strips.

* * * * *

UNITED STATES PATENT AND TRADEMARK OFFICE
CERTIFICATE OF CORRECTION

PATENT NO. : 5,410,124
DATED : April 25, 1995
INVENTOR(S) : Timothy L. Jackson

It is certified that error appears in the above-indentified patent and that said Letters Patent is hereby corrected as shown below:

Column 6, line 25, delete "optic sensor".

Signed and Sealed this

Twentieth Day of June, 1995

BRUCE LEHMAN

Attest:

Attesting Officer     *Commissioner of Patents and Trademarks*